United States Patent
Chiang et al.

(10) Patent No.: US 12,218,038 B2
(45) Date of Patent: Feb. 4, 2025

(54) LEADFRAME, SEMICONDUCTOR PACKAGE AND METHOD

(71) Applicant: Infineon Technologies Austria AG, Villach (AT)

(72) Inventors: Chau Fatt Chiang, Melaka (MY); Paul Armand Asentista Calo, Melaka (MY); Kok Yau Chua, Melaka (MY); Josef Hoeglauer, Heimstetten (DE); Swee Kah Lee, Melaka (MY); Khay Chwan Saw, Melaka (MY)

(73) Assignee: Infineon Technologies Austria AG, Villach (AT)

( * ) Notice: Subject to any disclaimer, the term of this patent is extended or adjusted under 35 U.S.C. 154(b) by 991 days.

(21) Appl. No.: 16/533,315

(22) Filed: Aug. 6, 2019

(65) Prior Publication Data
US 2020/0051898 A1  Feb. 13, 2020

(30) Foreign Application Priority Data
Aug. 7, 2018  (EP) .................................... 18187774

(51) Int. Cl.
*H01L 23/495* (2006.01)
*H01L 21/48* (2006.01)

(52) U.S. Cl.
CPC .... *H01L 23/49562* (2013.01); *H01L 21/4825* (2013.01); *H01L 23/4952* (2013.01); *H01L 23/49575* (2013.01)

(58) Field of Classification Search
CPC ......... H01L 23/49548; H01L 23/49517; H01L 23/49524; H01L 23/49562; H01L 23/49575; H01L 23/4952; H01L 2224/0603; H01L 2224/49111; H01L 2224/48137
See application file for complete search history.

(56) References Cited

U.S. PATENT DOCUMENTS

| | | | |
|---|---|---|---|
| 7,245,007 B1 | 7/2007 | Foster | |
| 2006/0226774 A1* | 10/2006 | Sofue | ..................... C08G 77/18 257/E33.059 |
| 2012/0175768 A1 | 7/2012 | Saito | |
| 2016/0141229 A1* | 5/2016 | Paek | ................. H01L 23/49548 257/676 |
| 2017/0025340 A1* | 1/2017 | Padmanabhan | ... H01L 23/49568 |

FOREIGN PATENT DOCUMENTS

| | | |
|---|---|---|
| CN | 106067458 A | 11/2016 |
| CN | 207338361 U | 5/2018 |
| KR | 19990069838 A | 9/1999 |

* cited by examiner

*Primary Examiner* — Vongsavanh Sengdara
(74) *Attorney, Agent, or Firm* — Murphy, Bilak & Homiller, PLLC

(57) ABSTRACT

In an embodiment, a leadframe includes a first electrically conductive part and a second electrically conductive part, each having an outer surface arranged to provide substantially coplanar outer contact areas having a footprint and an inner surface opposing the outer surface, the first part being spaced apart from the second part by a gap, a first recess arranged in the inner surface of the first part, a second recess arranged in the inner surface of the second part, and a first electrically conductive insert that is arranged in, and extends between, the first recess and the second recess and bridges the gap between the first part and the second part.

20 Claims, 7 Drawing Sheets

LEADFRAME, SEMICONDUCTOR PACKAGE AND METHOD

BACKGROUND

A semiconductor package may include one or more semiconductor devices in a housing. The package may include a substrate or a leadframe which includes outer contacts which are used to mount the electronic component on a redistribution board such as a printed circuit board. The package also includes internal electrical connections from the semiconductor device to the substrate or leadframe. The housing may include a plastic molding compound which covers the semiconductor device and the internal electrical connections.

SUMMARY

In an embodiment, a leadframe comprises a first electrically conductive part and a second electrically conductive part, each having an outer surface arranged to provide substantially coplanar outer contact areas having a footprint and an inner surface opposing the outer surface, the first part being spaced apart from the second part by a gap, a first recess arranged in the inner surface of the first part, a second recess arranged in the inner surface of the second part, and a first electrically conductive insert that is arranged in, and extends between, the first recess and the second recess and bridges the gap between the first part and the second part.

In an embodiment, a semiconductor package comprises a first semiconductor device and a leadframe comprising a first electrically conductive part and a second electrically conductive part, each having an outer surface arranged to provide substantially coplanar outer contact areas having a footprint and an inner surface opposing the outer surface, the first part being spaced apart from the second part by a gap, a first recess arranged in the inner surface of the first part, a second recess arranged in the inner surface of the second part, and a first electrically conductive insert that is arranged in, and extends between, the first recess and the second recess and bridges the gap between the first part and the second part. The insert forms a portion of an internal electrically conductive redistribution structure between the first semiconductor device and an outer contact area of the leadframe.

In an embodiment, a method of fabricating a semiconductor package comprises providing an electrically conductive leadframe comprising a first part and a second part, each having an outer surface providing an outer contact area and an inner surface opposing the outer surface, the first part being spaced apart from the second part by a gap, a first recess arranged in the inner surface of the first part and a second recess arranged in the inner surface of the second part, inserting an electrically conductive insert into the first recess and the second recess such that it extends from the first recess to the second recess and bridges the gap between the first part and the second part, mechanically attaching the insert to the first recess and the second recess and mounting a first semiconductor device onto the first part of the leadframe.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figure 1:
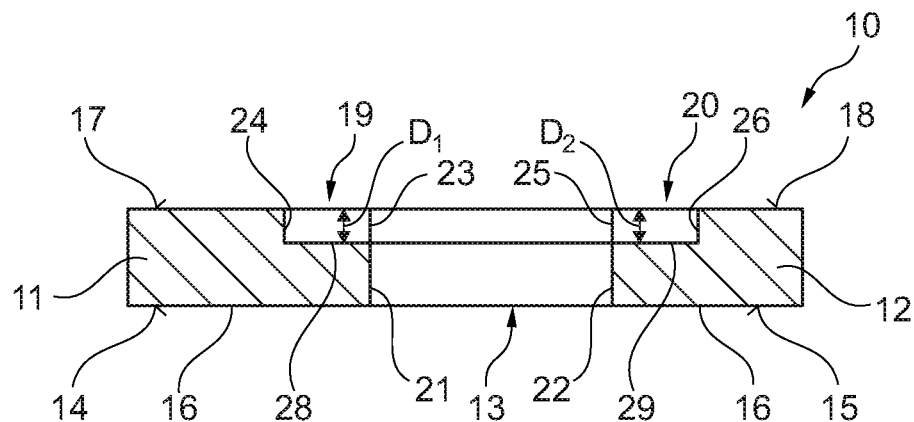
FIG. 1 illustrates a cross-sectional view of a leadframe for semiconductor package.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A leadframe including additional electrically conductive pieces and a semiconductor package including the leadframe with the additional pieces are provided. The additional separate electrically conductive pieces may be used as part of the internal redistribution structure provided by the leadframe and may bridge gaps between parts of the leadframe. The internal redistribution structure can be decoupled from the layout of the leadframe on its lower surface by the use of additional pieces attached to the upper surface of the leadframe. The additional flexibility in the internal redistribution structure can be used to provide additional functionality for the package, for example current sensing or source sensing. The electrically conductive pieces can also be positioned on portions of the leads of the leadframe to increase the available area on which bond connections may be formed. This enables the position of the bond wires within the package to be optimized to better avoid crossovers and the edges of devices within the package. The package reliability can be improved.

FIG. 1 illustrates a cross-sectional view of a leadframe 10 for a semiconductor package according to an embodiment. In the cross-sectional view, a first electrically conductive part 11 and a second electrically conductive part 12 of the leadframe 10 can be seen. The first part 11 is spaced apart from the second part 12 by a gap 13. Each of the first and second parts 11, 12 has an outer surface 14, 15, that is arranged to provide substantially coplanar outer contact areas 16 having a footprint, and an inner surface 17, 18 which opposes the outer surface 14, 15. The inner surface 17, 18 of one or both of the parts 11, 12 may be used to support a semiconductor device and may be a die pad or one or both of the parts may provide one or more leads of the leadframe 10. The leadframe 10 includes a first recess 19 arranged in the inner surface 17 of the first part 11 and a second recess 20 arranged in the inner surface 18 of the second part 12.

The first recess 19 extends to a side face 21 of the first part 11 of the leadframe such that the recess 19 has a base 28 and an open side 23 and provides a ledge or tread of a step. The first recess 19 is bounded on the remaining three sides 24 by side walls formed by the first part 11. The second recess 20 has a similar form and extends to a side face 22 of the second part 12 of the leadframe such that the second recess 20 has a base 29 and an open side 25 and is bounded on the remaining three sides 26 by side walls formed from the second part 12. The open sides 23, 25 of the recesses 19, 20 face towards one another.

The first recess 19 may have a depth D1 which is substantially the same as the depth D2 of the second recess 20. The thickness of the first and second leadframe parts 11, 12 is reduced in in the area under the first recess 19 and second recess 20 compared to regions outside of the first recess 19 and second recess 20. The outer surface 14, 15 of the first and second part 11, 12 is, however, substantially planar.

In other embodiments, the first recess 19 and/or the second recess 20 may be open on two sides and may be formed in a corner region of a substantially square or rectangular part of the leadframe 10. The first recess 19 and/or the second recess 20 may open on three sides by extending across the width of the first part or second part, respectively.

Figure 2:
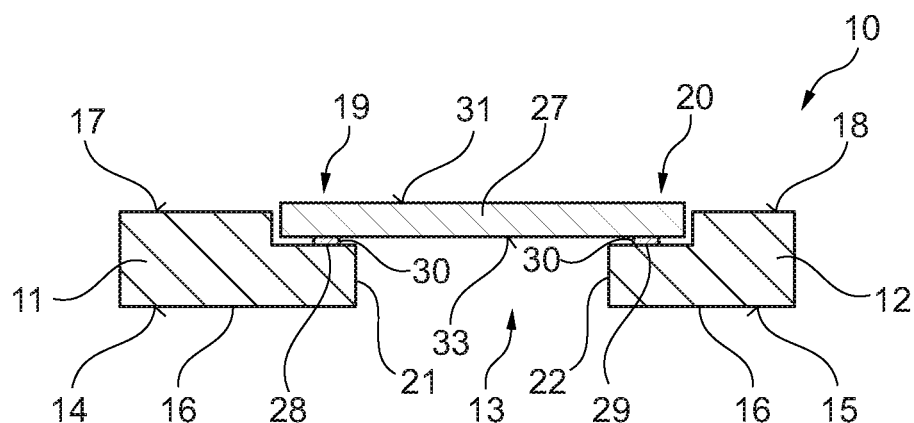
FIG. 2 illustrates a cross-sectional view of a leadframe and electrically conductive insert for use in semiconductor package.

FIG. 2 illustrates a cross-sectional view of the two parts 11, 12 of the leadframe 10 and an additional electrically conductive insert 27 which is arranged in and extends between the first recess 19 and the second recess 20 and bridges the gap 13 between the first part 11 and the second part 12 of the leadframe 10. The opposing ends of the insert 27 are attached to the base 28, 29 of the first and second recesses 11, 12, respectively. The insert 27 is attached to the recesses 19, 20 by an adhesive layer 30. The insert 27 has the form of a substantially rectangular plate.

The insert 27 is separate from the leadframe and has one lateral dimension which is greater than the minimum distance of the gap 13 between the first part 12 and the second part 13 in order that when it is positioned in the first recess 19 of the first part 11 and the second recess 20 of the second part 12, the insert 27 is able to bridge the gap 13 between the first part 11 and the second part 12. The first recess 19 and the second recess 20 are spaced apart by the gap 13 and together can be considered to form a depression in a surface of the leadframe 10 having a size and shape suitable for accommodating the insert 27.

The insert 27 may have a thickness which is slightly less than the thickness than the depth D1, D2 of the recesses 19, 20 in order that, when taking into account the material 30 that is positioned between the lower surface 33 of the insert 27 and the base 28, 29 of the recesses 19, 20, an upper surface 31 of the insert 27 is substantially coplanar with the inner surface 17 of the first part 11 and the inner surface 18 of the second part 12 of the leadframe 10.

The first part 11 and the second part 12 of the leadframe 10 may be fabricated from a metal plate, for example copper. The insert 27 may also be fabricated from a metal sheet or plate and may include the same metal as the leadframe, for example copper, or a different metal or alloy from that of the first and second part 11, 12.

The leadframe 10 that is positioned includes a conductive inner surface comprising the inner surface 17 of the first part 11, the upper surface 31 of the insert 27 and the inner surface 18 of the second part 12 that is substantially coplanar and has a lateral arrangement that differs from the lateral arrangement of the footprint of the leadframe 10 provided by the outer surfaces 14, 15 of the first and second parts 11, 12.

The electrically conductive insert 27 may be used as part of an internal rewiring structure of a semiconductor package including the leadframe 10. For example, the insert 27 may form part of an electrically conductive redistribution structure from a semiconductor device mounted on one part of the leadframe 10, for example the first part 11, to one or more further parts of the leadframe 10, for example the second part 12, or between any other two or more parts of the leadframe 10 that are spaced apart from one another with the gap between the two or more parts being bridged by the insert 27.

In some embodiments, the electrically conductive insert 27 is electrically connected to one or both of the first part 11 and second part 12 by the use of an electrically conductive material 30, for example electrically conductive adhesive or solder, for example, soft solder. In other embodiments, the electrically conductive insert 27 may be electrically insulated from one or both of the first part 11 and second part 12.

If the electrically conductive insert 27 is electrically connected to both the first part 11 and the second part 12, the electrically conductive insert electrically connects the first part 11 to the second part 12.

If the electrically conductive insert 27 is electrically insulated from both the first part 11 and second part 12, the insert 27 may provide purely mechanical or physical connection between the two parts 11, 12 of the leadframe 10, and at the same time an electrical connection between two further components of the package, for example between a semiconductor device and a lead of the leadframe.

In embodiments in which an electrically conductive connection between an insert and a leadframe is to be formed, the recess in which the insert is to be accommodated may include an electrically conductive coating. The insert may also include an electrically conductive coating, for example in at least the region that is to be in contact with the adhesive or solder and accommodated in the recess. The electrically conductive coating(s) may act as adhesion promoters and improve the electrical connection between the material of the leadframe and/or insert and the material of the adhesive or solder. The electrically conductive coating(s) may each include two or more sublayers.

If the electrically conductive insert 27 is electrically connected to one part, for example the first part 11, and is electrically insulated from the second part 12, the insert 27 can be used to provide an electrically conductive path from the first part 11 to a further part of the semiconductor package, for example a lead of the leadframe.

Figure 3:
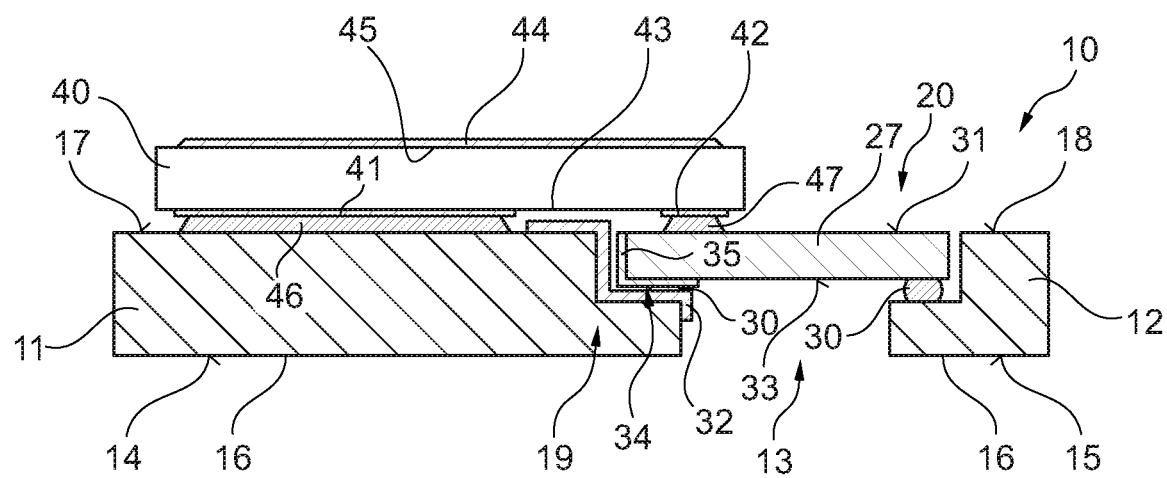
FIG. 3 illustrates a cross-sectional view of a leadframe, an electrically conductive insert and a semiconductor device.

FIG. 3 illustrates a cross-sectional view of the leadframe 10 according to an embodiment in which the leadframe 10 includes the first part 11 with the first recess 19 and the second part 12 with the second recess 20, whereby the gap 13 between the first and second recess 19, 20 is bridged by an electrically conductive insert 27. In this embodiment, the insert 27 is mechanically attached to and electrically connected to the second part 12 of the leadframe 10 by electrically conductive material 30 arranged between the lower side 33 of the insert 27 and the base 29 of the second recess 20. The insert 27 is mechanically attached to the first recess 19 of the first part 11 but is, however, electrically insulated from the first recess 19 and from the first part 11.

Figure 4:
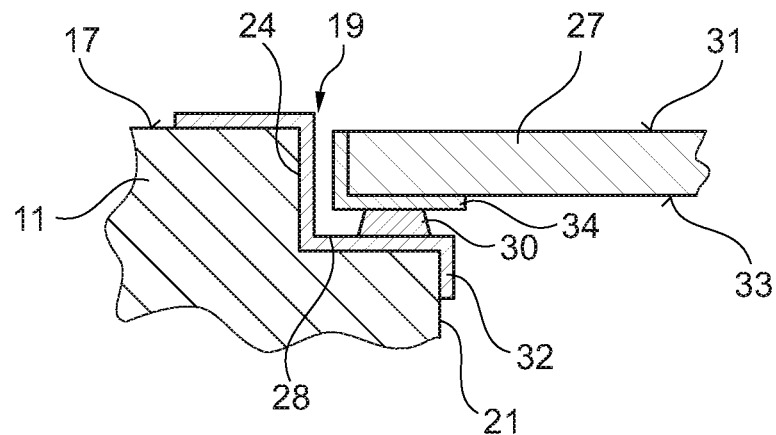
FIG. 4 illustrates a joint between a portion of a leadframe and an electrically conductive insert.

FIG. 4 shows an enlarged view of the connection between the insert 27 and the first recess 19 of the first part 11 in FIG. 3. In the embodiment illustrated in FIGS. 3 and 4, the first recess 19 is lined with an electrically insulating layer 32 which may cover the base 28 and side faces 24 of the first recess 19. The electrically insulating layer 32 may also extend over adjoining portions of the side face 21 of the first part 11 and inner surface 17 of the first part 11. In some embodiments, the lower side 33 and side faces 35 of the insert 27 may also be covered by a layer 34 of electrically insulating material.

The insert 27 is mechanically attached to the first part 11 by adhesive material 36 positioned between the electrically insulating layers 32, 34 so that the first distal end 37 of the insert 27 is mechanically attached in the first recess 19 in the first part 11 and is electrically insulated from the first part 11 by means of the insulating layers 32, 34. The adhesive material 30 may be electrically insulating or electrically conductive.

The second distal end 38 of the insert 27 is mechanically attached to the second recess 20 and electrically connected to the second part 12 by an electrically conductive material such as adhesive or solder. The second distal end 38 of the insert 27 is uncovered by electrically insulating material and has electrically conductive surfaces for providing the electrically conductive connection between the insert 27 and the second part 12 of the leadframe 10. The upper surface 31 of the insert 27 is substantially coplanar with the inner surface 17 of the first part and the inner surface 18 of the second part of the leadframe 10.

In this embodiment, a semiconductor device 40 is provided which is a vertical MOSFET device including a source contact pad 41 and gate contact pad 42 on a first side 43 and a drain contact pad 44 on the second side 45, which opposes the first side 43. The semiconductor device 40 is arranged with respect to the inner surface 17 of the first part 11 such that the source contact pad 41 faces towards and is mounted on the inner surface 17 of the first part 11 and such that the gate contact pad 42 faces towards and is mounted on the upper surface 31 of the insert 27. The drain electrode 44 faces upwardly away from the leadframe 10.

The source contact pad 41 is electrically connected to the first part 11 by a layer of conductive material 46 which may be a conductive adhesive or soft solder, for example. The gate electrode 42 is electrically connected to the insert 27 by the adhesive 47 which may include conductive adhesive or soft solder, for example. The body of the semiconductor device 40 extends between and is positioned above first part 11, the first recess 19 and the insert 27. The gate pad 42 is electrically connected to the insert 27 and to the second part 12 as the insert 27 is electrically conductive and is electrically connected to the second recess 20 in the second part 12 by the conductive material 30. The gate electrode 42 is, however, electrically insulated from the first part 11 of the leadframe 10 and from the source of the transistor device 40 by the electrically insulating layers 32, 34 which ensure an electrically insulating connection between the insert 27 and the first recess 19 of the first part 11.

In this embodiment, the insert 27 provides a portion of the internal electrically conductive redistribution structure between the semiconductor device 40, in particular the gate pad 42, and the second part 12 of the leadframe 10. This internal electrically conductive redistribution structure is substantially planar. The lower surface 33 of the insert 27 is positioned within the semiconductor package, as it is supported on the recesses 19, 20 formed in the inner surface 17, 20 and does not form part of the footprint of the leadframe 10 provided by the outer contact surfaces 16 on the opposing side of the leadframe 10.

The upwardly facing drain pad 44 is electrically connected to one or more further leads of the leadframe 10 which cannot be seen in the cross-sectional view of FIG. 3. The one or more further leads may be substantially coplanar with the first and second parts 11, 12 so that the lower side of the leads is substantially coplanar with the lower surfaces 14, 15 of the first and second parts 11, 12 and can form outer contact areas 16 of the footprint. The electrical connection may be formed by one or more bond wires or a contact clip, for example.

Figure 5:
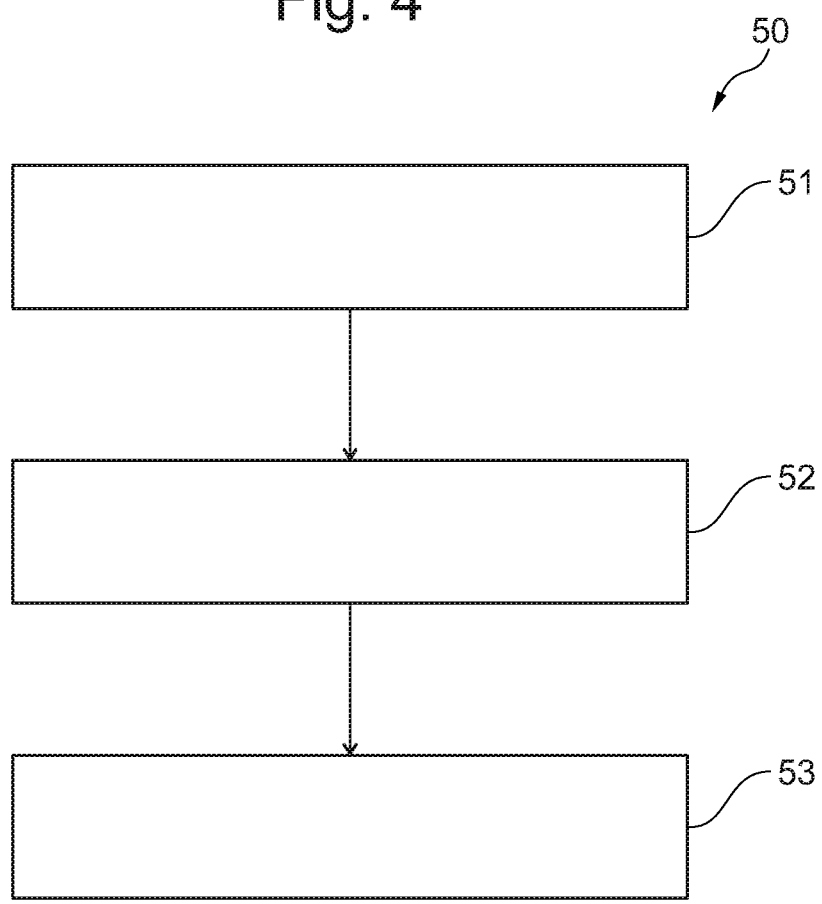
FIG. 5 illustrates a flow diagram of a method for fabricating a leadframe.

FIG. 5 illustrates a flow diagram 50 of a method for fabricating a leadframe. In block 51, an electrically conductive leadframe for a semiconductor package is provided. The leadframe comprises a first part and a second part, each having an outer surface arranged to provide substantially coplanar outer contact areas having a footprint and each of the first and second parts having an inner surface. The first part is spaced apart from the second part by a gap. The leadframe may provide a leadframe for a single semiconductor package and may be provided as part of a leadframe strip including a plurality of leadframes, each for semiconductor package, which are held together in the strip by connection bars.

In block 52, portions of the inner surface of the first part and the second part of the leadframe are removed to produce a first recess in the first part and a second recess in the second part. In block 53, at least one leadframe portion is provided which has a thickness which is less than or equal to a depth of the first recess and the depth of the second recess. The leadframe portion has lateral dimensions such that when arranged in the first recess and in the second recess, the leadframe portion is able to extend from the first recess to the second recess and bridge the gap between the first part and the second part.

The leadframe portion is, therefore, separate from the leadframe and has one lateral dimension which is greater than the minimum distance of the gap between the first part and the second part in order that when it is positioned in the first recess of the first part and the second recess of the second part, it is able to bridge the gap between the first part and the second part. The leadframe portion can be considered to be an insert.

The portions of the inner surface of the first part and second part of the leadframe may be removed by etching, for example chemical etching, or milling.

The method may further include applying an electrically insulating coating to at least one of the first recess and the second recess. An electrically conductive coating may also be applied to a major surface and optionally side faces of the leadframe portion.

In order to provide an electrically insulating connection between the leadframe portion and the recess in the part of the leadframe, one or both of the recess and the leadframe portion may be coated with an electrically insulating material. In some embodiments, the leadframe portion is partially coated with the electrically insulating material such that regions of the leadframe portion which are to form an electrically conductive connection are uncoated by the electrically insulating coating.

The leadframe and leadframe portion may be supplied as a kit of parts for subsequent assembly during fabrication of a semiconductor package. Alternatively, the leadframe portion may be attached to the leadframe and, in particular, the first recess and second recess, by an adhesive, which may be electrically conducting or electrically insulating, or by solder, for example.

Figure 6:
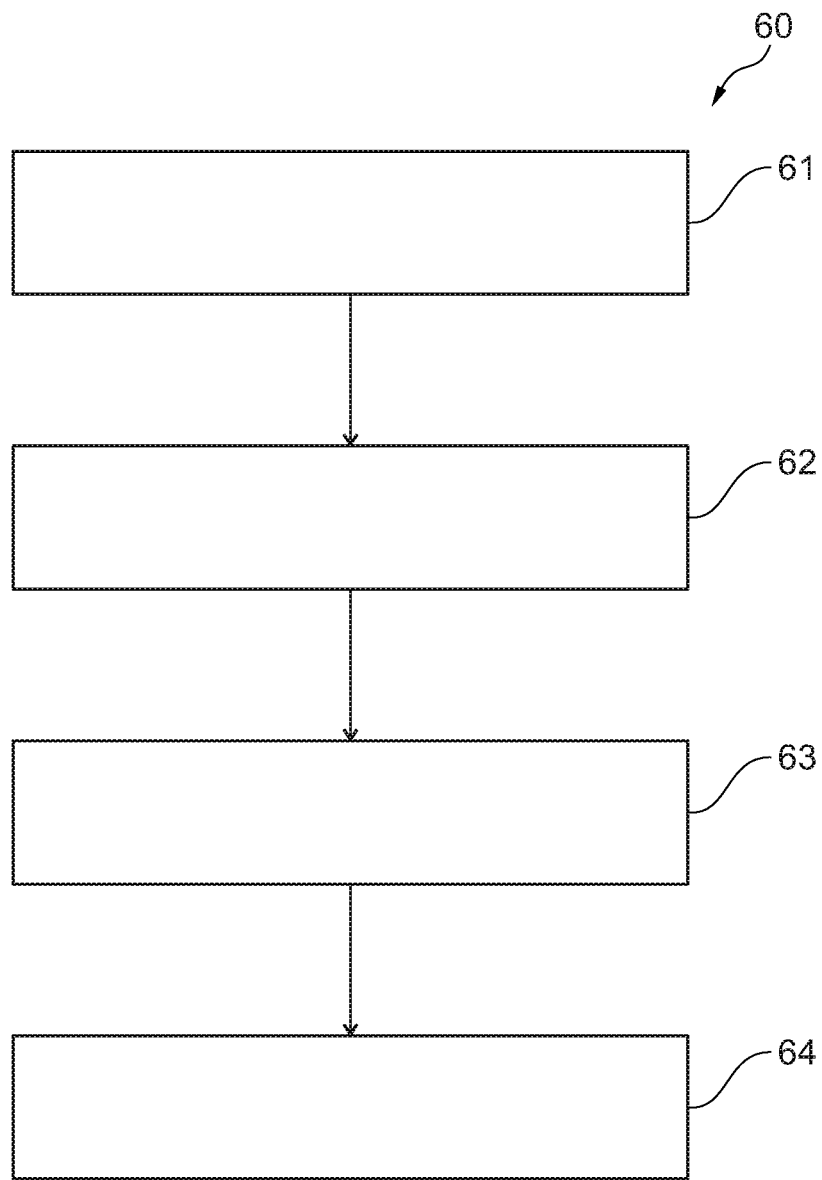
FIG. 6 illustrates a flowchart of a method for fabricating a semiconductor package.

FIG. 6 illustrates a flowchart 60 of a method for fabricating a semiconductor package. In block 61, an electrically conductive leadframe is provided which includes a first part and the second part, each having an outer surface providing an outer contact area and an inner surface opposing the outer surface. The first part is spaced apart from the second part by a gap and a first recess is arranged in the inner surface of the first part and second recess is arranged in the inner surface of the second part. In block 62, an electrically conductive insert is inserted into the first recess and into the second recess such that it extends from the first recess to the second recess and bridges the gap between the first part and the second part. In block 63, the insert is mechanically attached to the first recess and to the second recess. In block 64, a first semiconductor device is mounted onto the first part of the leadframe.

The insert may be mechanically attached to the first recess and the second recess by an adhesive, which may be electrically conductive or electrically insulating, or by a solder.

The method may further include electrically connecting the insert to at least one of the first part and the second part, or electrically insulating the insert form at least one of the first part and the second part.

The insert may be electrically connected to at least one of the first part and the second part by the use of a conductive material that is used to mechanically attach the insert to the first recess and the second recess, for example solder or an electrically conductive adhesive such as a silver epoxy. For example, the insert may be electrically connected to the first part and the second part. In this embodiment, the insert acts as an electrically conductive planar redistribution structure from the first part to the second part of the leadframe and electrically connects the first part and the second part. Since the insert is attached to the first and second recess which are formed in the inner surface of the first and second part, respectively, the insert is not positioned in the same plane as the outer surface of the leadframe and, therefore, does not form an outer contact of the leadframe.

The arrangement of the conductive surfaces provided by the leadframe parts and insert or inserts at the inner side of the leadframe differs from the arrangement of the conductive surfaces at the outer side of the leadframe which provide the outer contact areas and footprint of the leadframe. The inserts and recesses in the inner side of the leadframe may be used to provide different internal redistribution structures for the same footprint or a similar footprint.

In order to electrically insulate the insert from at least one of the first part and the second part, the insert and/or the recess may be coated with an electrically insulating material. The adhesive used to attach the insert in the recess may be electrically conductive or electrically insulating, since the electrical insulation is provided by the coating. In embodiments in which the insert is electrically insulated from both the first part and the second part, the insert may form part of an electrically conductive redistribution structure between two or more further parts of the semiconductor package, for example between the semiconductor device and a third part of the semiconductor package, for example a lead of the leadframe or a further insert or a further semiconductor device.

In some embodiments, the insert is electrically connected to the first part and electrically insulated from the second part, or vice versa. In this embodiment, the insert may act as an electrically conductive redistribution structure from the first part to a third part, for example a lead of the semiconductor package. The mechanical attachment of the insert to the second part may be used to provide mechanical stability for the insert.

In some embodiments, the electrically conductive insert further comprises an electrically conductive coating on a lower surface and, optionally, side faces of the electrically conductive insert, the lower surface facing towards the inner surface of the first part and the second part of the leadframe. At least one of the first recess and the second recess may be coated with an electrically conductive coating. The electrically conductive coating may be used to improve the electrical connection between the material of the adhesive or solder and the material of the leadframe and/or insert, for example by promoting adhesion and/or by providing a contactable surface that is less prone to the effects of oxidation.

The first semiconductor device may be electrically coupled to the insert by one or more bond wires. The first semiconductor device may be electrically connected to the insert by attaching a contact pad of the semiconductor device to the insert by a conductive layer. In other words, the contact pad may be mounted on the insert. This embodiment may be used, for example, for a transistor device having a source down arrangement such that the source contact pad or gate contact pad may be mounted on the insert. The insert may be used as a lateral redistribution structure from the downwardly facing contact pad to a laterally adjacent portion of the leadframe.

Figure 7:
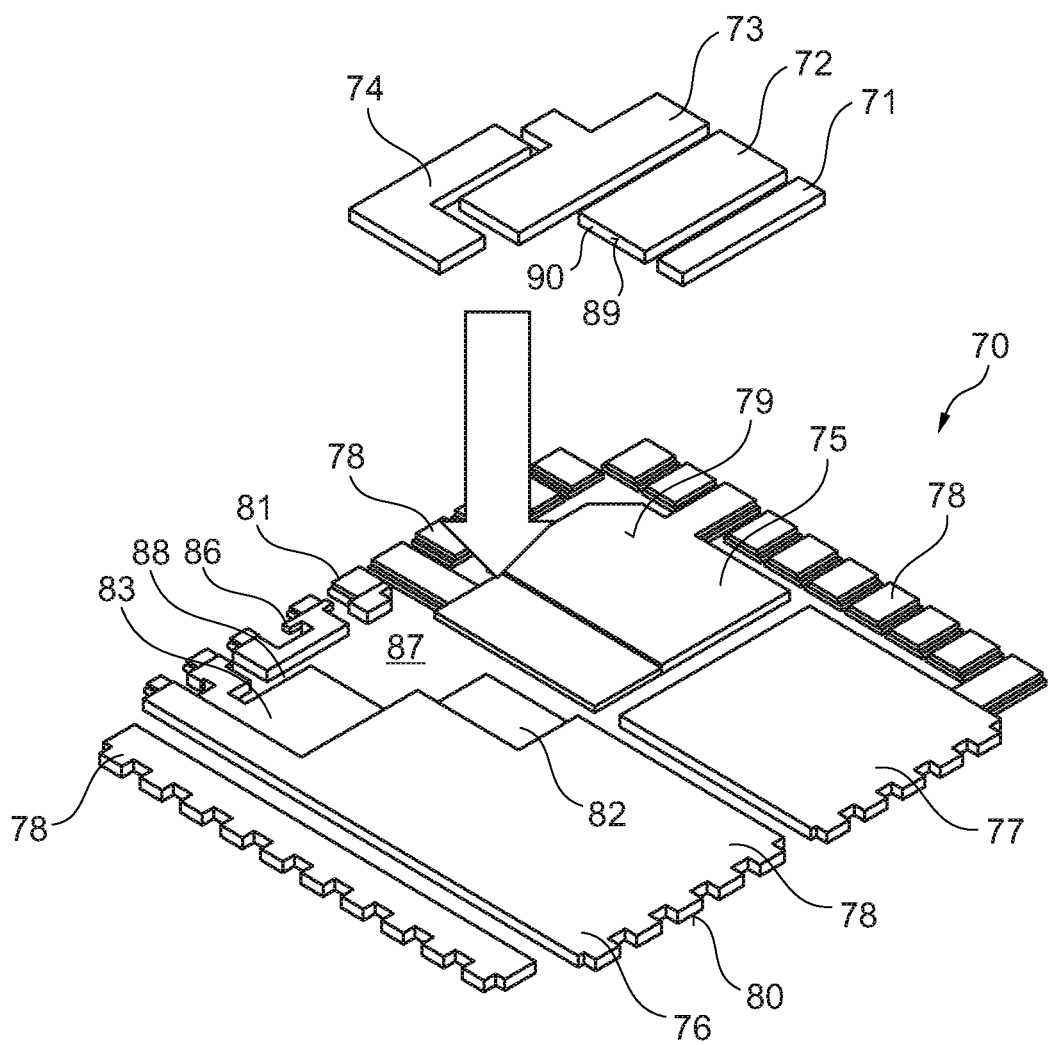
FIG. 7 illustrates a perspective view of a leadframe and multiple electrically conductive inserts.

FIG. 7 illustrates a perspective view of an electrically conductive leadframe 70 and multiple electrically conductive inserts. The multiple inserts may be used to provide an internal redistribution structure for the leadframe that is independent of the footprint provided by the leadframe. In the embodiment illustrated in FIG. 7, the leadframe 70 is used in a semiconductor package including a half-bridge circuit with two switching devices, such as two semiconductor transistor devices, and a driver chip. The package may also include further functions such as source sensing.

The leadframe 70 includes three parts 75, 76, 77 which are spaced apart from one another and are configured to each support a semiconductor device, four separate inserts 71, 72, 73, 74 and leads 78 which are positioned laterally adjacent the parts 75, 76, 77. Some leads 78 extend from and are integral with the parts 75, 76, 77 and other leads 78 bare spaced apart and separate from the parts 75, 76, 77. The leads 78 and parts 75, 76, 77 are substantially coplanar and have inner surfaces 79 which are substantially coplanar and outer surfaces 80 which are substantially coplanar and provide outer contacts having a predetermined footprint. The leadframe 70 may have a substantially square shape in plan view and include leads 78 along each edge.

The first part 75 and the third part 77 of the leadframe 70 each have a substantially square form in plan view and are arranged adjacent one side of the second part 76 which has a substantially rectangular shape in plan view. A first recess 81 is arranged in the inner surface 79 of the first part 75 and is positioned in the inwardly facing side edge of the first part 75. The recess 81 extends long the entire length of the inwardly facing side edge of the first part 75 that faces the second part 76 and forms a ledge at the edge of the first part 75.

A second recess 82 and a third recess 83 are arranged in the inner surface 79 of the second part 76. The second recess 82 and the third recess 83 extend from an inwardly facing side face of the second part 76 to form two ledges which face towards the first recess 81. The third recess 83 is laterally larger than the second recess 82 and has a larger length such that the inner surface 79 of the second part 76 has a stepped form in plan view. The third recess 83 is situated in one corner and further towards the outermost edge of the leadframe than the second recess 82. The gap 87 between the first part 75 and the second part 76 is narrower in the region between the first recess 81 and the second recess 82 than in the region between the first recess 81 and the third recess 83.

The leadframe 70 also includes leads 85 which are arranged adjacent and spaced apart from an outwardly facing side of the second part 76. The leads 85 include a fourth recess 86 in the inner surface 79. The fourth recess 86 faces towards the third recess 83 and second recess 82.

The recesses 81, 82, 83, 86 together form a depression or common recess having a size and shape for accommodating all four of the inserts 71, 72, 73, 74. The recesses 81, 82, 83, 86 each have a depth which is substantially the same and which is slightly greater than the thickness of the inserts 71, 72, 73, 74.

The first insert 71 and the second insert 72 have a substantially rectangular shape in plan view and have approximately the same length. The second insert 72 is has a greater width than the first insert 71. The first insert 71 and the second insert 72 each have a length which is capable of bridging the gap 87 between the first recess 81 in the first part 75 and the second recess 82 in the second part 76.

The third insert 73 has a T-shaped form in plan view. The cross of the T shape has a length which is capable of bridging the gap 87 between the first recess 81 in the first part 75 and the third recess 83 in the second part 76 with the upright of the T shape facing the towards the edge of the package. The fourth insert 74 has an L-shaped form and may have lateral dimensions such that the vertical longer arm can be positioned adjacent the upright and one side of the T-shaped third insert 73 and such that the horizontal shorter arm of the L shape can be positioned adjacent the width of the one side of the T-shaped third insert 73. The fourth insert 74 is positioned in the third recess 83 and fourth recess 86 and bridges the gap 88 between the second part 76 and the leads 85.

Figure 8:
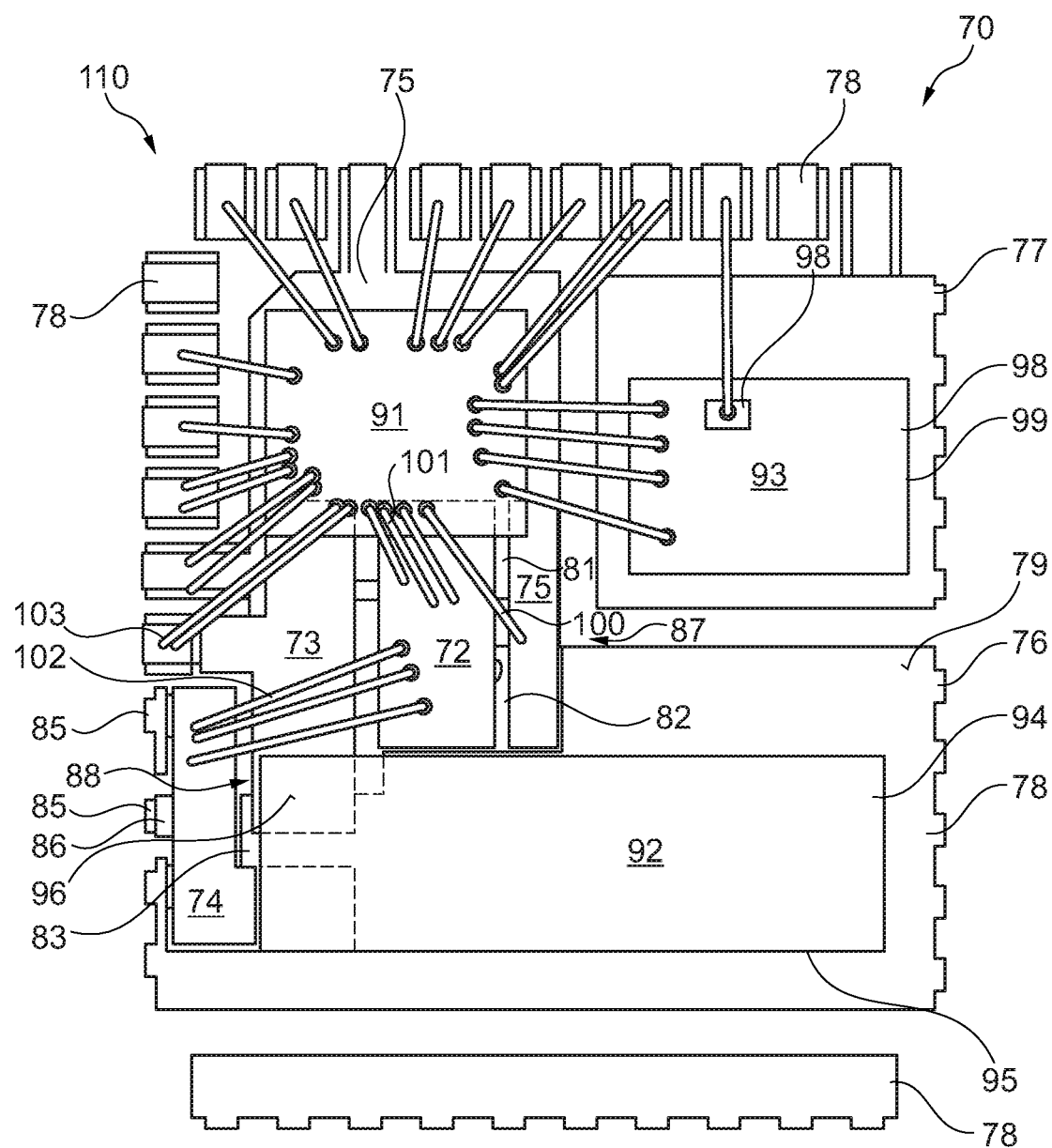
FIG. 8 illustrates a plan view of semiconductor package including a leadframe, multiple inserts and three semiconductor devices.

FIG. 8 illustrates a plan view of semiconductor package including the leadframe 70 with the four inserts 71, 72, 73, 74 inserted into and accommodated within the recesses 81, 82, 83, 86 and with three semiconductor devices 91, 92, 93 arranged on the first part 75, second part 76 and third part 77 of the leadframe 70, respectively. In an embodiment, the first semiconductor device 91 is a driver chip and the second and third semiconductor devices 92, 93 are transistor devices. The upper surfaces of the four inserts 71, 72, 73, 74 are substantially coplanar with the inner surface 79 of the first part 75 and second part 76.

The first insert 71 and the second insert 72 are arranged laterally adjacent one another and extend from the first recess 81 to the second recess 82. The third insert 73 extends between the first recess 81 and the third recess 83 and the fourth recess 86, such that the cross of the T extends between the first recess 81 and the third recess 83 and the upright of the T is positioned in the fourth recess 86. The fourth insert 74 extends between the third recess 83 and the fourth recess 86. The fourth insert 74 is arranged towards the lateral edge of the third recess 83 and the fourth recess 86 such that it is spaced apart from the third insert 73. All four inserts 71, 72, 73, 74 are spaced apart from one another.

The first semiconductor device 91 is arranged on the first part 75 and may partially overlap a portion of the first insert 71, second insert 72 and third insert 73 which are arranged in the first recess 81.

The second semiconductor device 92 is mounted on the second part 76 and is arranged adjacent the second recess 82 and above the third recess 83 and also above portions of the third insert 73 and fourth insert 74 arranged in the third recess 83. The second semiconductor device 92 is a transistor device having a drain contact pad 94 on its upper surface and a source contact pad 95 on its lower surface which mounted on and electrically connected to the inner surface 79 of the first second part 76. The second semiconductor device 92 also has a gate contact pad 96 which is arranged on the lower surface and is positioned above, mounted on and electrically connected to the third insert 73. The source pad 92 or an additional source sense pad may be arranged above and mounted on the fourth insert 74 in a position above the third recess 83.

The third semiconductor device 93 may also be a transistor device having a source pad 97 and gate pad 98 on its upper surface and a drain pad 99 on its lower surface. The drain pad 99 is mounted on the inner surface 79 of the third part 76 and electrically connected to the third part 76 of the leadframe 70. The two transistor devices 92, 93 may be coupled to form half bridge arrangement in the finished semiconductor package.

The multiple inserts 71, 72, 73, 74 may provide different functions. In the embodiment illustrated in FIGS. 7 to 9, the fourth inserts 71, 72, 73, 74 provide a variety of electrically conductive redistribution structures which are internal to the semiconductor package.

The first insert 71 is electrically conductively connected to the first recess 81 and the second recess 82 and, therefore, to the first part 75 and the second part 76 of the leadframe 70. Since the source pad 95 of the transistor device 92 is mounted on and electrically coupled to the second part 76, the first insert 71 is electrically coupled to the source pad 95 of the transistor 92 and, therefore, to a low-voltage potential, for example ground. Since the first insert 71 extends between the second recess 82 and the first recess 81 and is also electrically coupled to the first part 75, the first part 75 is also coupled to the same low-voltage connection. The first semiconductor device 91 is electrically coupled to the first insert 71 by one or more bond wires 100 which can be used to provide a ground connection for the first semiconductor device 91.

In contrast to the first insert 71, the second insert 72 is electrically insulated from the first recess 81 and the second recess 82 and, therefore, electrically insulated from the first part 75 and second part 76 of the leadframe. The second insert 72 provides an electrically conductive portion of a redistribution structure from the first semiconductor device 91 to the leads 85 of the leadframe 70 and to the fourth insert 74 by means of one or more bond wires 101 which couple the first semiconductor device 91 to the second insert 72 and by one or more bond wires 102 which electrically connect the second insert 72 to the fourth insert 74 and to the leads 85. The bond wires 102 are arranged laterally adjacent the corner of the transistor device 92 and can be positioned independently of the position of the contact pads on the upper surface of the first semiconductor chip 91 relative to the leads 85. Since the bond wires 102 from the first semiconductor device 91 are connected to the fourth insert 74, which is electrically connected to the underlying leads 85, the fourth insert 74 provides a larger area for wire bonding than the leads 85.

The third insert 73 is electrically insulated from the first recess 81 and the third recess 86 but is electrically conductively connected to the portion of the fourth recess 86 which is positioned on the lead 103. The gate contact pad 96 of the transistor device 92 is mounted on and electrically connected to the third insert 73 but is electrically insulated from the underlying portion of the third recess 83 in the inner surface 79 of the second part 76 and from the first recess 81 in the inner surface 79 of the first part 75 and, therefore, from the first part 75 and second part 76 of the leadframe 70. The gate pad 96 is, however, electrically connected by means of the third insert 73 to the lead 103 due to the electrical conductive connection between the upright of the T-shaped insert 73 and the lead 103. Therefore, the third insert 73 is mechanically supported by the first recess 81 and the third recess 83 and acts as a lateral conductive rewiring structure between the downwardly facing gate pad 96 and the gate lead 103 of the leadframe 70.

The fourth insert 74 is electrically insulated from the third recess 83 and electrically conductively connected to the fourth recess 86 and the leads 85. The source pad 95 on the lower surface of the transistor device 92 is mounted on and electrically conductively connected to the fourth insert 74 so that the fourth insert 74 acts as a lateral electrically conductive rewiring structure from the downwardly facing source pad 96 to the contacts 85. The fourth insert 74 and leads 85 may be used to provide source sensing. The fourth insert 74 is electrically insulated from the third recess 83 and, therefore, the second part 76 on which the source pad 95 is mounted and, therefore, enables a source sensing function which is independent of the potential of the second part 76.

In order to produce the electrically insulative connections between the inserts, which are formed of electrically conductive material, and the leadframe 70 which is also formed of electrically conductive material, an electrically insulative material is applied to one or both of the insert and recess in which an electrically insulating connection is desired.

In the embodiment illustrated in FIGS. 7 to 9H, the third recess 83 is coated with electrically insulating material and the first and second recesses 81, 82 are coated with an electrically insulating material in regions which are to support the second, third and fourth inserts 72, 73, 74. The lower surface 89 and side faces 90 of the second insert 72, the cross T-shaped portion of the third insert 73 and the shorter arm of the L-shaped fourth insert 74 are also coated with an electrically conductive insulating material. The upright of the T-shaped third insert 73, the longer arm of the L-shaped fourth insert 74 and the first insert 71 are uncoated hand have electrically conductive outer surfaces.

FIGS. 9A to 9H illustrate a method according to an embodiment for fabricating a semiconductor package such as the semiconductor package 110 illustrated in FIG. 8. The fabrication of a single semiconductor package 110 is illustrated. However, typically a number of packages are fabricated in the same process with the leadframe 70 being one of a number of leadframe positions of a leadframe strip. Similarly, the inserts 71, 72, 73, 74 of a leadframe position may be provided connected to a frame and in the form of a leadframe strip with multiple leadframe positions.

Figure 9A:
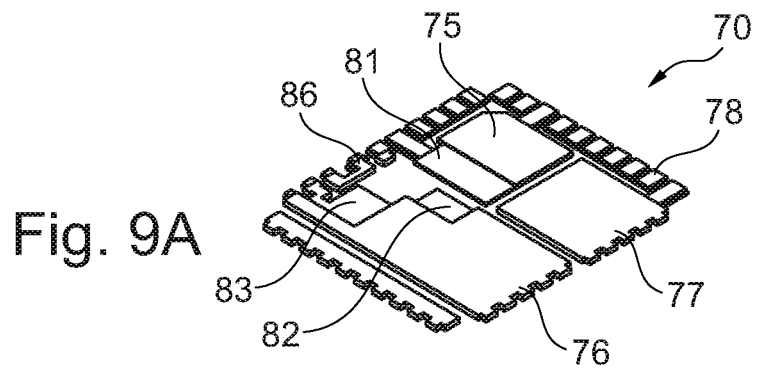
FIGS. 9A to 9H illustrate a method according to an embodiment for fabricating the semiconductor package of FIG. 8.

As illustrated in FIG. 9A, the leadframe 70 including the parts 75, 76, 77 and the leads 78 is provided. The leadframe 70 includes four recesses, the first recess 81 in the inner surface of the first part 75, the second recess 82 in the inner surface of the second part 76, the third recess 83 in the inner surface of the second part 76 and the fourth recess 86 formed in portions of some of the leads 85, 103 positioned adjacent the third recess 82. In this embodiment, the recesses can be considered to form a common recess into which the four inserts 71, 72, 73, 74 can be accommodated.

Figure 9B:
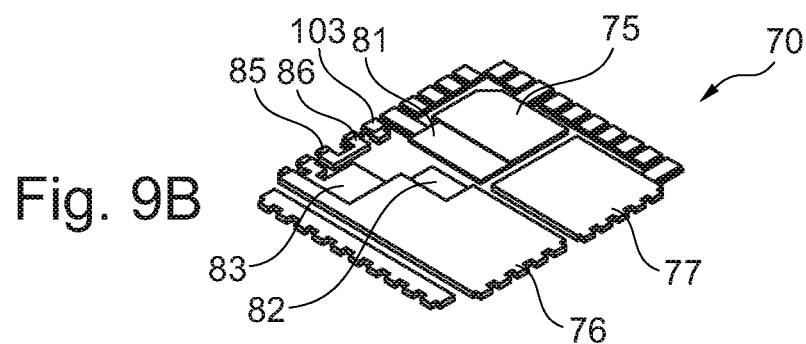

For the semiconductor package 110 illustrated in FIG. 8, the portion of the first recess 81 and second recess 82 positioned nearest to the third part 77 of the leadframe 70 and the fourth recess 86 accommodate electrically conductive connections between the first insert 71 and the underlying portion of the first part 75 and second part 76 and between the third insert 73 and the lead 103 and between the fourth insert and the leads 85. As illustrated in FIG. 9B, these regions of the first recess 71, second recess 72 and fourth recess 86 include a conductive surface. The remaining portions of the first recess 81, the second recess 82 and the third recess 83 are coated with an electrically insulative material.

At least the distal end of the shorter arm of the fourth insert 74 and at least the distal ends of the cross of the third insert 73 and at least the distal ends of the second insert 72 are also coated with an electrically insulative material on the lower surface 89 and, optionally, the side faces 90. In contrast, the first insert 71, the upright of the third insert 73 accommodated in the fourth recess 86 and the portion of the long arm of the fourth insert 74 accommodated in the fourth recess 86 remain uncoated and include an electrically conductive lower surface 89 and are used to form electrically conductive connections.

Figure 9C:
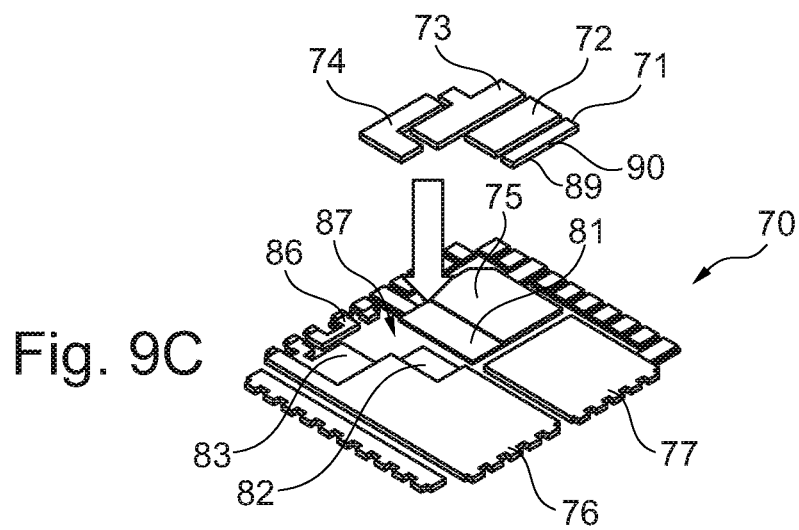
Figure 9D:
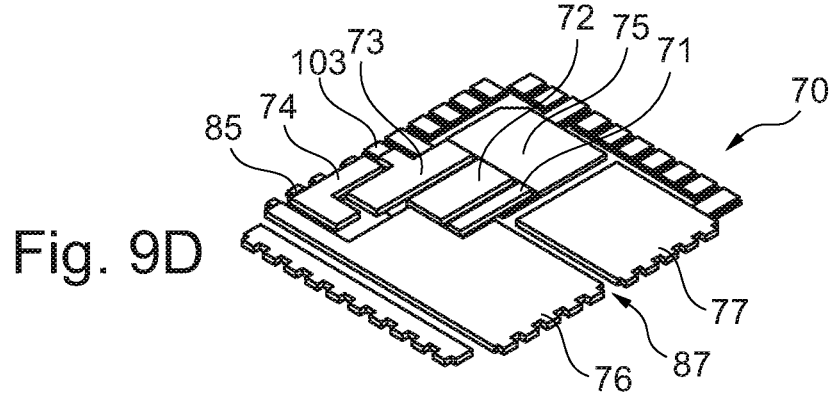

In FIG. 9C, conductive adhesive is applied to the first recess 31, the second recess 82, the third recess 83 and the fourth recess 86. The first insert 71, second insert 72, third insert 73 and fourth insert 74 placed onto the leadframe 70 such that the first insert 71 is arranged in and supported by the first recess 81 and the second recess 82 and bridges the gap 87 between the first part 75 and the second part 76 of the leadframe 70. The second insert 72 is arranged in and supported by first recess 81 and the second recess 82 such that it also bridges the gap 87 between the first part 75 and the second part 76. The third insert 73 extends between the first recess 81, the third recess 83 and a portion of the fourth recess 86 arranged on the lead 103. The fourth insert 74 is placed in the third recess 83 and in the fourth recess 86 such that it is arranged around the distal portion and extends to the upright of the T of the third insert 73. The four inserts 71, 72, 73, 74 are laterally spaced apart from one another. The adhesive is then cured as illustrated in FIG. 9D.

An electrically conductive adhesive may be used in order to produce the electrically conductive connections. The electrically insulating coating on the inserts 72, 73, 74 and recesses 81, 82, 83, 86 is used to prevent an electrical connection from being formed, for example between the second insert 72 and the first and second parts 75, 76 even if an electrically conductive adhesive is used.

Solder may be used in place of the electrically conductive adhesive, for example, for embodiments in which the inserts form electrically conductive connections with the underlying parts of the leadframe. For embodiments, in which the inserts are not required to form electrically conductive connections with the leadframe, an electrically insulating adhesive may be used. In some embodiments, electrically conductive adhesive material may be used for the electrically conductive connections and an electrically insulating adhesive material may be used for the electrically insulating connections.

Figure 9E:
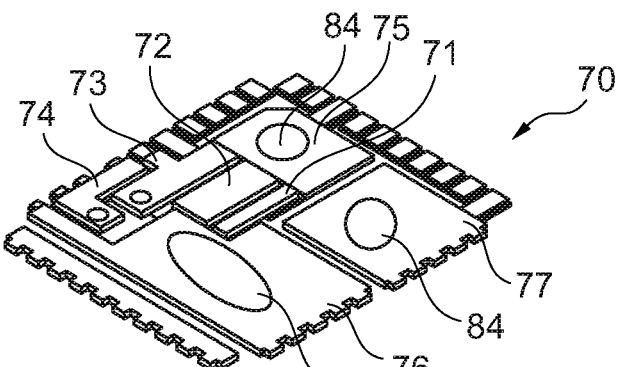

As illustrated in FIG. 9E, solder 84, for example solder paste, is then dispensed onto the inner surface of the first part 75, the second part 76 and the third part 77 of the leadframe 70 on which the semiconductor devices 91, 92 and 93 are to be mounted. Solder 84 is also dispensed onto the distal ends of the third insert 73 and fourth insert 74 positioned in the third recess 83 on to which the gate pad 96 and source pad 95 of the transistor 92 are to be mounted.

Figure 9F:
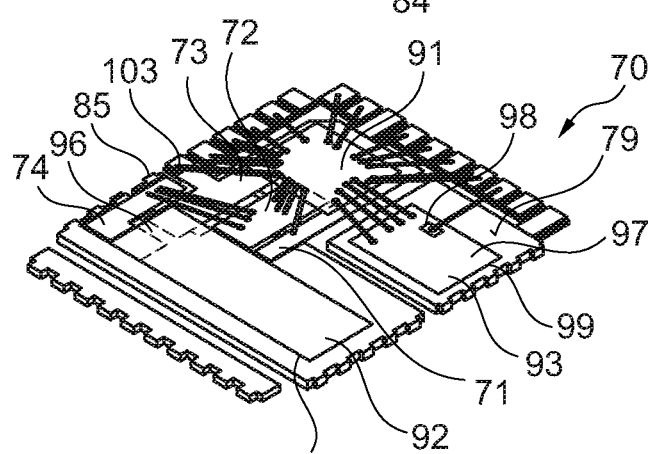

As is illustrated in FIG. 9F, the first semiconductor device 91 is mounted on the inner surface 79 of the first part 75 and is positioned substantially adjacent the first recess 81. The first semiconductor device 91 may overlap the distal end of the first insert 71, second insert 72 and third insert 73 positioned in the first recess 81. The transistor device 92 is mounted in a source down arrangement such that the source pad 95 is mounted on and electrically connected to the inner surface of the second part 76 and such that the gate pad 96 is positioned above and mounted on and electrically connected to the third insert 73 and, consequently, to the lead 103 and such that the source pad 96 or a further source sense pad is positioned above and mounted on and electrically connected to the fourth insert 74 and electrically connected to the leads 85.

The second transistor device 93 is mounted such that its drain pad 99 faces downwards and is mounted on and electrically connected to the third part 77 of the leadframe 70 and such that its source pad 97 and gate pad 98 face upwardly. FIG. 9F also illustrates the fabrication of the bond wires 100 between the first semiconductor device 91 and the first insert 71, bond wires 101 between the first semiconductor device 91 and the second insert 72, the bond wires 102 between the second insert 72 and the fourth insert 74, bond wires 105 between the first semiconductor device 91 and the second transistor device 93, bond wires 106 between the first semiconductor device 91 and leads 78 and a bond wire 104 between the gate pad 98 of the second transistor device 93 and the lead 107 of the leadframe 70.

Figure 9G:
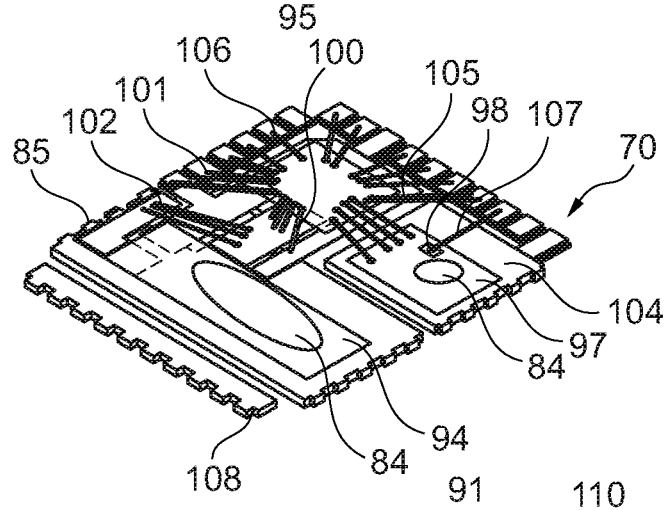

As illustrated in FIG. 9G, in order to form half bridge circuit between the two transistor devices 92, 93, solder 84 is placed onto the upwardly facing source pad 97 of the second transistor device 93, the upwardly facing drain pad 94 of the transistor device 92 and the set of leads 108 forming the output node which are arranged adjacent side face of the second part 76 of the leadframe 70.

Figure 9H:
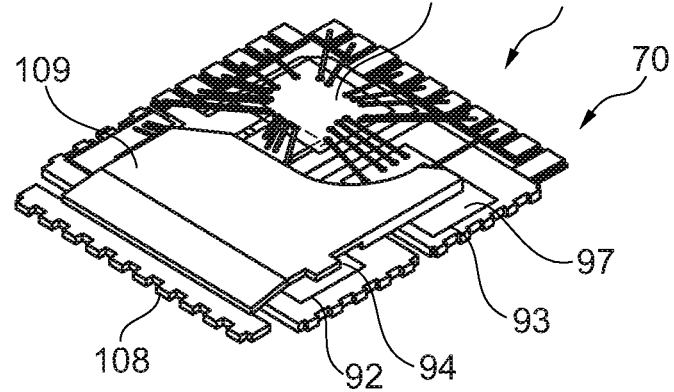

As illustrated in FIG. 9H, a contact clip 109 is attached to the source pad 97 of the transistor 93, the drain pad 94 of the transistor device 92 and the leads 108. The contact clip 109 electrically connects the source pad 97 of the transistor 93, the drain pad 94 of the transistor device 92 with the leads 108. The arrangement may be subjected to a solder reflow treatment to form solder connections between the semiconductor devices 91, 92, 93, the leadframe 70 and the contact clip 109. The inner surface 79 of the leadframe 70, the semiconductor devices 91, 92, 93, the contact clip 109 and the bond wires may then be embedded in a non-illustrated moulding compound in order to produce the semiconductor package 110.

Through the use of additional electrically conductive pieces, which are separate from the leadframe, the internal redistribution structure provided by the leadframe can be decoupled from the layout of the leadframe on its lower surface. The use of recesses in the upper surface of the leadframe, which is positioned within the package housing or molding, enables the electrically conductive pieces to be accommodated within the thickness of the leadframe and form inserts and also enables the upper surface of the electrically conductive pieces to be substantially coplanar with the upper surface of the remaining portions of the leadframe. The electrically conductive pieces can be positioned on portions of the leads of the leadframe to increase the available area on which bond connections may be formed. Furthermore, the position of the bond wires within the package can be optimized to better avoid cross-overs and the edges of devices within the package. The package reliability can be improved and the additional flexibility in the internal redistribution structure can be used to provide additional functionality for the package, for example current sensing or source sensing.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A leadframe, comprising:
    a first electrically conductive part and a second electrically conductive part, each having an outer surface arranged to provide substantially coplanar outer contact areas having a footprint and an inner surface opposing the outer surface, the first electrically conductive part being spaced apart from the second electrically conductive part by a gap;
    a first recess arranged in the inner surface of the first electrically conductive part;
    a second recess arranged in the inner surface of the second electrically conductive part; and
    a first electrically conductive insert arranged in, and extending between, the first recess and the second recess and bridging the gap between the first electrically conductive part and the second electrically conductive part.

2. The leadframe of claim 1, wherein an upper surface of the first electrically conductive insert is substantially coplanar with the inner surface of the first electrically conductive part and with the inner surface of the second electrically conductive part of the leadframe.

3. The leadframe of claim 1, further comprising an electrically insulating coating on a lower surface of the first electrically conductive insert, and wherein the lower surface faces towards the inner surface of the first electrically conductive part and the inner surface of the second electrically conductive part.

4. The leadframe of claim 3, wherein the electrically insulating coating is on side faces of the first electrically conductive insert.

5. The leadframe of claim 1, wherein at least one of the first recess and the second recess is coated with an electrically insulating coating.

6. The leadframe of claim 1, wherein the first electrically conductive insert is mechanically attached to and electrically insulated from the first electrically conductive part and the second electrically conductive part.

7. The leadframe of claim 1, wherein the first electrically conductive insert is mechanically attached to and electrically connected to the first electrically conductive part and the second electrically conductive part.

8. The leadframe of claim 1, wherein the first electrically conductive insert comprises a first lateral end that is disposed within the first recess, a second lateral end that is disposed within the second recess, and a planar lower surface that extends along a single plane between the first and second lateral end.

9. The leadframe of claim 8, wherein the first electrically conductive insert comprises a planar upper surface opposite from the planar lower surface, and wherein the planar upper surface of the first electrically conductive insert extends along a second single plane between the first and second lateral ends, the second single plane being parallel to and spaced apart from the single plane.

10. The leadframe of claim 8, wherein the planar lower surface of the first electrically conductive insert is mechanically attached and/or electrically connected to the inner surface of the first electrically conductive part in the first recess, and wherein the planar lower surface of the first electrically conductive insert is mechanically attached and/or electrically connected to the inner surface of the second electrically conductive part in the second recess.

11. The leadframe of claim 1, wherein the first electrically conductive part comprises a step shaped transition from a thicker portion of the first electrically conductive part to the first recess, wherein the thicker portion of the first electrically conductive part has a uniform thickness and extends from the step shaped transition of the first part to an outer lateral end of the first electrically conductive part, wherein the second electrically conductive part comprises a step shaped transition from a thicker portion of the second electrically conductive part to the second recess, wherein the thicker portion of the second electrically conductive part has a uniform thickness and extends from the step shaped transition of the second electrically conductive part to an outer lateral end of the second part.

12. A semiconductor package, comprising:
    a first semiconductor device; and
    a leadframe comprising:
        a first electrically conductive part and a second electrically conductive part, each having an outer surface arranged to provide substantially coplanar outer contact areas having a footprint and an inner surface opposing the outer surface, the first electrically conductive part being spaced apart from the second electrically conductive part by a gap;
        a first recess arranged in the inner surface of the first electrically conductive part;
        a second recess arranged in the inner surface of the second electrically conductive part; and
        a first electrically conductive insert arranged in, and extending between, the first recess and the second recess and bridging the gap between the first electrically conductive part and the second electrically conductive part; and
    wherein the first electrically conductive insert forms a portion of an internal electrically conductive redistribution structure between the first semiconductor device and an outer contact area of the leadframe.

13. The semiconductor package of claim 12, wherein the first semiconductor device is mounted on the first electrically conductive part and on the first electrically conductive insert of the leadframe.

14. The semiconductor package of claim 13, wherein the first semiconductor device is a transistor device having a source contact pad and a gate contact pad, wherein the first electrically conductive insert is mechanically attached to and electrically insulated from the first electrically conductive part of the leadframe and is mechanically attached to and electrically connected to the second electrically conductive part of the leadframe, and wherein the source contact pad of the transistor device is mounted on and electrically connected to the first electrically conductive part of the leadframe and the gate contact pad of the transistor device is mounted on and electrically connected to the first electrically conductive insert.

15. The semiconductor package of claim 12, further comprising a second semiconductor device, wherein the first semiconductor device is mounted on the first electrically conductive part of the leadframe and the second semiconductor device is mounted on the second electrically conductive part of the leadframe.

16. The semiconductor package of claim 15, wherein the first electrically conductive insert is mechanically attached to and electrically connected to the first electrically conductive part and to the second electrically conductive part of the leadframe, wherein the first semiconductor device is electrically coupled to the first electrically conductive insert by a bond wire, wherein the second semiconductor device is a transistor device having a source pad, wherein the source pad of the transistor device is mounted on and electrically coupled to the second electrically conductive part of the leadframe and is electrically coupled to the first electrically conductive insert.

17. The semiconductor package of claim 15, wherein the first electrically conductive insert is mechanically attached to and electrically insulated from the first electrically conductive part and from the second electrically conductive part of the leadframe and is mechanically attached to and electrically connected to a fourth part of the leadframe, the fourth part of the leadframe being spaced apart from the first electrically conductive part and the second electrically conductive part of the leadframe.

18. The semiconductor package of claim 12, wherein the first electrically conductive insert is mechanically attached to and electrically insulated from the first electrically conductive part and the second electrically conductive part of the leadframe, wherein the first semiconductor device is electrically coupled to the first electrically conductive insert by one or more bond wires, and wherein the first electrically conductive insert is electrically coupled to a third electrically conductive part of the leadframe by one or more bond wires, the third electrically conductive part of the leadframe being spaced apart from the first electrically conductive part and the second electrically conductive part of the leadframe.

19. The semiconductor package of claim 18, wherein the first electrically conductive insert is mechanically attached to and electrically insulated from the first electrically conductive part and from the second electrically conductive part of the leadframe and is mechanically attached to and electrically connected to a fourth part of the leadframe, the fourth part of the leadframe being spaced apart from the first electrically conductive part and the second electrically conductive part of the leadframe.

20. The semiconductor package of claim 18, further comprising a second electrically conductive insert mechanically attached to and electrically insulated from the second electrically conductive part of the leadframe and mechanically attached to and electrically connected to a fourth part of the leadframe, wherein the fourth part of the leadframe is spaced apart from the first electrically conductive part, the second electrically conductive part and the third electrically conductive part of the leadframe, and wherein a contact pad of the first semiconductor device is electrically coupled to the second electrically conductive insert and the fourth part of the leadframe.

* * * * *